US009673760B2

(12) United States Patent
Otake

(10) Patent No.: US 9,673,760 B2
(45) Date of Patent: Jun. 6, 2017

(54) POWER AMPLIFICATION DEVICE AND CONTROL METHOD OF POWER AMPLIFICATION DEVICE

(71) Applicant: NEC Corporation, Minato-ku, Tokyo (JP)

(72) Inventor: Sumitaka Otake, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/914,327

(22) PCT Filed: Sep. 9, 2013

(86) PCT No.: PCT/JP2013/005331
§ 371 (c)(1),
(2) Date: Feb. 25, 2016

(87) PCT Pub. No.: WO2015/033379
PCT Pub. Date: Mar. 12, 2015

(65) Prior Publication Data
US 2016/0211805 A1      Jul. 21, 2016

(51) Int. Cl.
*H03F 3/68*  (2006.01)
*H03F 1/52*  (2006.01)
(Continued)

(52) U.S. Cl.
CPC ............ *H03F 1/0288* (2013.01); *H03F 1/52* (2013.01); *H03F 3/19* (2013.01); *H03F 3/211* (2013.01);
(Continued)

(58) Field of Classification Search
CPC . H03F 1/07; H03F 1/0288; H03F 3/68; H03F 1/3252; H03F 1/06; H03F 3/24; H03F 3/60; H03F 1/52
(Continued)

(56) References Cited

U.S. PATENT DOCUMENTS 4,257,003 A * 3/1981 Yool ...................... G01R 23/02
                                                   324/76.14
7,248,108 B2 * 7/2007 Fratti ................... H03F 1/0288
                                                   330/124 R
(Continued)

FOREIGN PATENT DOCUMENTS

JP     S62-181024 U    11/1987
JP     H06-152265 A     5/1994
(Continued)

OTHER PUBLICATIONS

International Search Report for PCT Application No. PCT/JP2013/005331, mailed on Dec. 10, 2013.
(Continued)

*Primary Examiner* — Steven J. Mottola
*Assistant Examiner* — Hafizur Rahman

(57) ABSTRACT

A power amplification device (1) according to an exemplary embodiment of the invention includes a Doherty amplifier (10) that is adjusted to operate at a set frequency, a frequency comparator (11) that compares a supplied frequency being a frequency of an input signal RF_IN to the Doherty amplifier (10) with the set frequency, and a protection circuit (12) that sets an operating state of the Doherty amplifier (10) to inactive when the supplied frequency and the set frequency are different. It is thereby possible to protect the Doherty amplifier (10) when the input signal RF_IN with a frequency different from the set frequency is supplied.

13 Claims, 10 Drawing Sheets

(51) Int. Cl.
*H03F 1/02* (2006.01)
*H03F 3/19* (2006.01)
*H03F 3/21* (2006.01)

(52) U.S. Cl.
CPC .. *H03F 2200/192* (2013.01); *H03F 2200/231* (2013.01); *H03F 2200/451* (2013.01); *H03F 2200/78* (2013.01); *H03F 2203/21139* (2013.01)

(58) Field of Classification Search
USPC ..... 330/84, 86, 124 R, 126, 130, 295, 207 P, 330/298; 333/117, 122, 124, 204, 205, 333/219, 248; 379/338, 443; 455/127.1, 455/143
See application file for complete search history.

(56) References Cited

U.S. PATENT DOCUMENTS

| | | | |
|---|---|---|---|
| 2011/0043956 A1 | 2/2011 | Su et al. | |
| 2011/0140786 A1* | 6/2011 | Blednov | H03F 1/0288 330/295 |
| 2012/0286866 A1* | 11/2012 | Khanifar | H03F 1/3247 330/149 |
| 2013/0016447 A1* | 1/2013 | Kitabata | H05K 9/0067 361/56 |
| 2014/0323067 A1* | 10/2014 | Hammi | H03F 1/3294 455/127.2 |

FOREIGN PATENT DOCUMENTS

| | | | | |
|---|---|---|---|---|
| JP | H07-245541 A | 9/1995 | | |
| JP | H11-234050 A | 8/1999 | | |
| JP | 2006-191581 A | 7/2006 | | |
| JP | 2006-222889 A | 8/2006 | | |
| JP | 2008-017072 A | 1/2008 | | |
| JP | 2011-182312 A | 9/2011 | | |
| JP | 2012-015602 A | 1/2012 | | |
| JP | 2012-114711 A | 6/2012 | | |
| NL | EP 2741422 A1 * | 6/2014 | ............... | G01S 7/03 |

OTHER PUBLICATIONS

Japanese Office Action for JP Application No. 2015-535182 mailed on Apr. 25, 2017 with English Translation.
Extended European Search Report for EP Application No. EP13893120.9 dated on Apr. 18, 2017.

* cited by examiner

POWER AMPLIFICATION DEVICE AND CONTROL METHOD OF POWER AMPLIFICATION DEVICE

This application is a National Stage Entry of PCT/JP2013/005331 filed on Sep. 9, 2013, the contents of all of which are incorporated herein by reference, in their entirety.

TECHNICAL FIELD

The present invention relates to a power amplification device and a control method of the power amplification device and, particularly, to a power amplification device that includes a Doherty amplifier and a control method of the power amplification device.

BACKGROUND ART

A Doherty amplifier is widely used as an amplifier that operates with high efficiency while maintaining the linearity. The Doherty amplifier has a structure in which a carrier amplifier and a peak amplifier are connected in parallel between an input terminal and an output terminal. Further, the Doherty amplifier has a transmission line for matching the output impedance between the carrier amplifier and the peak amplifier. In the Doherty amplifier, the carrier amplifier and the peak amplifier operate when an output is at a high level, and only the carrier amplifier operates and the peak amplifier stops operating when an output is at a low level. By such operation, the Doherty amplifier can operate with high efficiency even when the output power is significantly lower than the saturation power.

Patent Literature 1 discloses a technique related to a Doherty amplifier capable of high-efficient operation even when a signal to be amplified is a high frequency band signal. The Doherty amplifier disclosed in Patent Literature 1 has two paths that are connected in parallel between an input terminal and an output terminal. A carrier amplifier including a first transistor and a first transmission line having an electrical length that is about ¼ wavelength of the frequency of an input signal are connected in series to one path. A second transmission line having an electrical length that corresponds to a phase difference of the first transmission line and a peak amplifier including a second transistor are connected in series to the other path. The first transistor and the second transistor are placed so that the output direction vector of a signal to be transmitted is 180 degrees.

CITATION LIST

Patent Literature

PTL1: Japanese Unexamined Patent Publication No. 2012-114711

SUMMARY OF INVENTION

Technical Problem

As described in the above Background Art, the Doherty amplifier includes a transmission line for matching the output impedance between the carrier amplifier and the peak amplifier. For example, in the Doherty amplifier disclosed in Patent Literature 1, the transmission line having an electrical length that is about ¼ wavelength of the frequency of an input signal is included. In this manner, the length of the transmission line of the Doherty amplifier corresponds to the frequency (set frequency) of an input signal to the Doherty amplifier. In other words, the Doherty amplifier is designed to operate at a specified set frequency. Heretofore, the Doherty amplifier has been used in the environment where the frequency of an input signal is constant. In the case of applying the Doherty amplifier to equipment (for example, broadcast equipment) where the frequency of an input signal varies frequently, when an input signal with a frequency different from the set frequency is supplied to the Doherty amplifier, the Doherty amplifier cannot operate normally or the Doherty amplifier can be damaged in some cases. However, the case where the set frequency and the frequency of an input signal are different is not assumed in the Doherty amplifier, and therefore a protection circuit for the purpose of protecting the Doherty amplifier has not been placed.

In light of the foregoing, an exemplary object of the present invention is to provide a power amplification device capable of protecting a Doherty amplifier when a signal with a frequency different from a set frequency is supplied, and a control method of the power amplification device.

Solution to Problem

A power amplification device according to an exemplary aspect of the preset invention includes a Doherty amplifier that is adjusted to operate at a first frequency, a frequency comparator that compares a second frequency being a frequency of an input signal to the Doherty amplifier with the first frequency, and a protection circuit that sets an operating state of the Doherty amplifier to inactive when the first frequency and the second frequency are different.

A control method of a power amplification device according to an exemplary aspect of the preset invention includes acquiring information related to the first frequency being a set frequency of a Doherty amplifier, acquiring information related to a second frequency being a frequency of an input signal to the Doherty amplifier, and comparing the first frequency with the second frequency, and when the first frequency and the second frequency are different, setting an operating state of the Doherty amplifier to inactive.

A computer readable medium according to an exemplary aspect of the preset invention is a non-transitory computer readable medium storing a program causing a computer to perform a process including acquiring information related to the first frequency being a set frequency of a Doherty amplifier, acquiring information related to a second frequency being a frequency of an input signal to the Doherty amplifier, and comparing the first frequency with the second frequency, and when the first frequency and the second frequency are different, setting an operating state of the Doherty amplifier to inactive.

Advantageous Effects of Invention

According to the exemplary aspects of the present invention, it is possible to provide a power amplification device capable of protecting a Doherty amplifier when a signal with a frequency different from a set frequency is supplied, and a control method of the power amplification device.

DESCRIPTION OF EMBODIMENTS

First Exemplary Embodiment

An exemplary embodiment of the present invention is described hereinafter with reference to the drawings.

Figure 1:
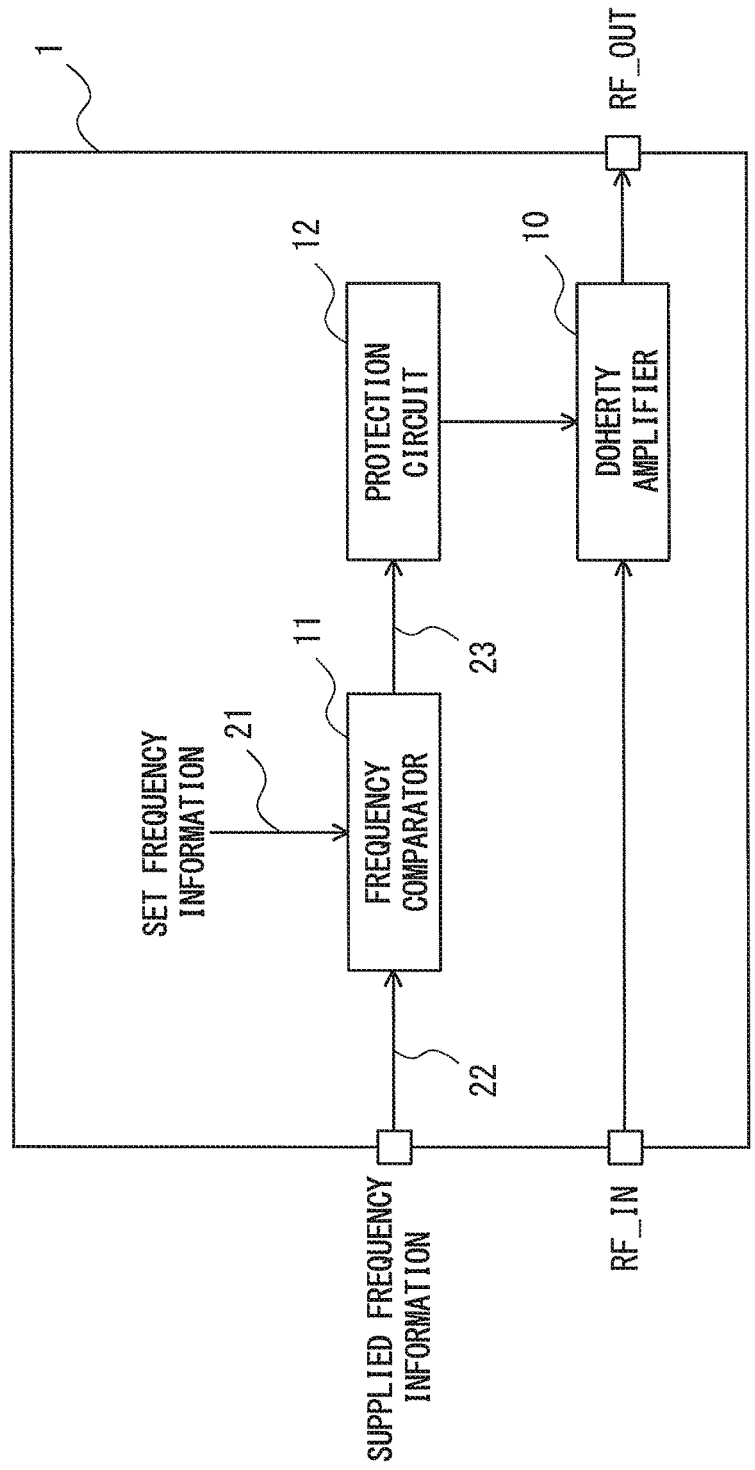
FIG. 1 is a block diagram showing a power amplification device according to a first exemplary embodiment.

FIG. 1 is a block diagram showing a power amplification device according to a first exemplary embodiment. As shown in FIG. 1, the power amplification device 1 according to this exemplary embodiment includes a Doherty amplifier 10, a frequency comparator 11, and a protection circuit 12.

The Doherty amplifier 10 amplifiers an input signal RF_IN and outputs an amplified output signal RF_OUT. The Doherty amplifier 10 is adjusted to operate at a set frequency (first frequency). For example, when the power amplification device 1 is a transmitter for broadcasting, a broadcast signal is supplied as the input signal RF_IN to the Doherty amplifier 10. In this case, the input signal RF_IN is generated in a signal generation device (not shown) that generates a broadcast signal.

Figure 2:
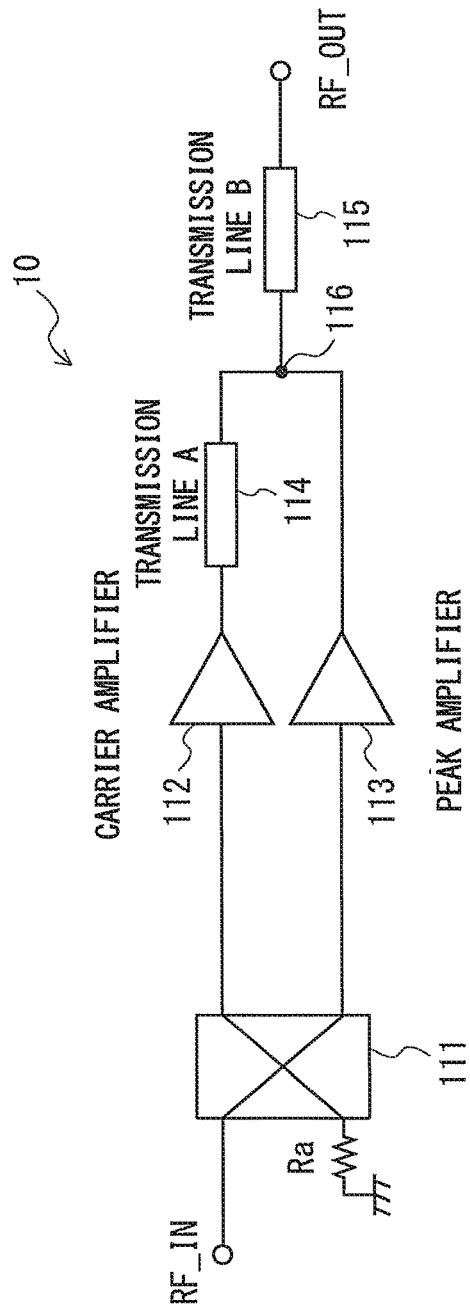
FIG. 2 is a view showing one example of a Doherty amplifier included in the power amplification device according to the first exemplary embodiment.

FIG. 2 is a view showing one example of the Doherty amplifier 10. As shown in FIG. 2, the Doherty amplifier 10 includes a 90° hybrid coupler 111, a carrier amplifier 112, a peak amplifier 113, a transmission line A (114), and a transmission line B (115).

The 90° hybrid coupler 111 branches the input signal RF_IN into two signals and supplies the two branch signals to the carrier amplifier 112 and the peak amplifier 113, respectively. An absorbing resistor Ra is connected to the 90° hybrid coupler 111. When the signal branched by the 90° hybrid coupler 111 is reflected by the carrier amplifier 112 and the peak amplifier 113, the absorbing resistor Ra absorbs the reflected signal.

The carrier amplifier 112 is an amplifier that is biased to class A, class AB or class B. An output signal of the carrier amplifier 112 is output to a node 116 through the transmission line A (114). The transmission line A (114) is a transmission line that has a length corresponding to the set frequency of the Doherty amplifier 10 (which is a length that is ¼ wavelength of the set frequency), and it is placed for impedance matching of the Doherty amplifier. The peak amplifier 113 is an amplifier that is biased to class C. An output of the peak amplifier 113 is output to the node 116.

A signal that is supplied from the 90° hybrid coupler 111 to the peak amplifier 113 is out of phase by −90° degrees with respect to a signal that is supplied from the 90° hybrid coupler 111 to the carrier amplifier 112. Further, the phase of an output signal of the carrier amplifier 112 is shifted by −90° degrees by passing through the transmission line A (114). Accordingly, when the carrier amplifier 112 and the peak amplifier 113 are operating, a signal that is output to the node 116 from the path with the carrier amplifier 112 and the transmission line A (114) and a signal that is output to the node 116 from the path with peak amplifier 113 have substantially the same phase.

The transmission line B (115) is placed between the node 116 and an output terminal, and it is a transmission line that has a length corresponding to the set frequency of the Doherty amplifier 10 (which is a length that is ¼ wavelength of the set frequency). The transmission line B (115) is placed for impedance matching of the Doherty amplifier. In this manner, in the Doherty amplifier 10, the lengths of the transmission line A (114) and the transmission line B (115) are determined based on the frequency (set frequency) of the input signal RF_IN to the Doherty amplifier 10. In other words, the Doherty amplifier 10 is designed to operate at a specified set frequency.

Note that the Doherty amplifier shown in FIG. 2 is one example, and the power amplification device 1 according to this exemplary embodiment may include a Doherty amplifier having a different configuration.

Set frequency information 21 and supplied frequency information 22 are supplied to the frequency comparator 11 shown in FIG. 1. The set frequency information 21 is information about a set frequency at which the Doherty amplifier 10 operates. For example, the set frequency information 21 is stored in a memory (set frequency information storage unit) included in the power amplification device 1. The supplied frequency information 22 is information about a frequency (second frequency) of the input signal RF_IN that is supplied to the Doherty amplifier 10. For example, the supplied frequency information 22 is supplied from an upper-level device (not shown) to the power amplification device 1 by serial communication. The upper-level device (not shown) may be a separate device from a signal generation device (no shown) that generates the input signal RF_IN. Alternatively, the upper-level device that supplies the supplied frequency information 22 and the signal generation device that generates the input signal RF_IN may be one device.

The frequency comparator 11 shown in FIG. 1 compares the supplied frequency of the input signal RF_IN that is supplied to the Doherty amplifier 10 with the set frequency of the Doherty amplifier 10 and outputs a comparison result 23 to the protection circuit 12.

When the supplied frequency of the input signal RF_IN that is supplied to the Doherty amplifier 10 and the set frequency of the Doherty amplifier 10 are different, the protection circuit 12 sets the operating state of the Doherty amplifier 10 to inactive. In this case, the Doherty amplifier 10 does not operate, and the output signal RF_OUT is not output from the power amplification device 1. On the other hand, when the supplied frequency of the input signal RF_IN that is supplied to the Doherty amplifier 10 and the set frequency of the Doherty amplifier 10 are the same, the protection circuit 12 sets the operating state of the Doherty amplifier 10 to active. In this case, the Doherty amplifier 10 operates, and the output signal RF_OUT is output from the power amplification device 1.

The case where the supplied frequency and the set frequency are the same includes the case where the supplied frequency and the set frequency are substantially the same. Specifically, even when the supplied frequency and the set frequency are not completely the same, if the Doherty amplifier operates normally (that is, if the operating performance higher than a specified criterion is satisfied), it is considered that the supplied frequency and the set frequency are substantially the same. Stated differently, the case where the supplied frequency and the set frequency are different is the case where the absolute value of a difference between the supplied frequency and the set frequency are is so large that the Doherty amplifier does not operate normally.

Figure 3:
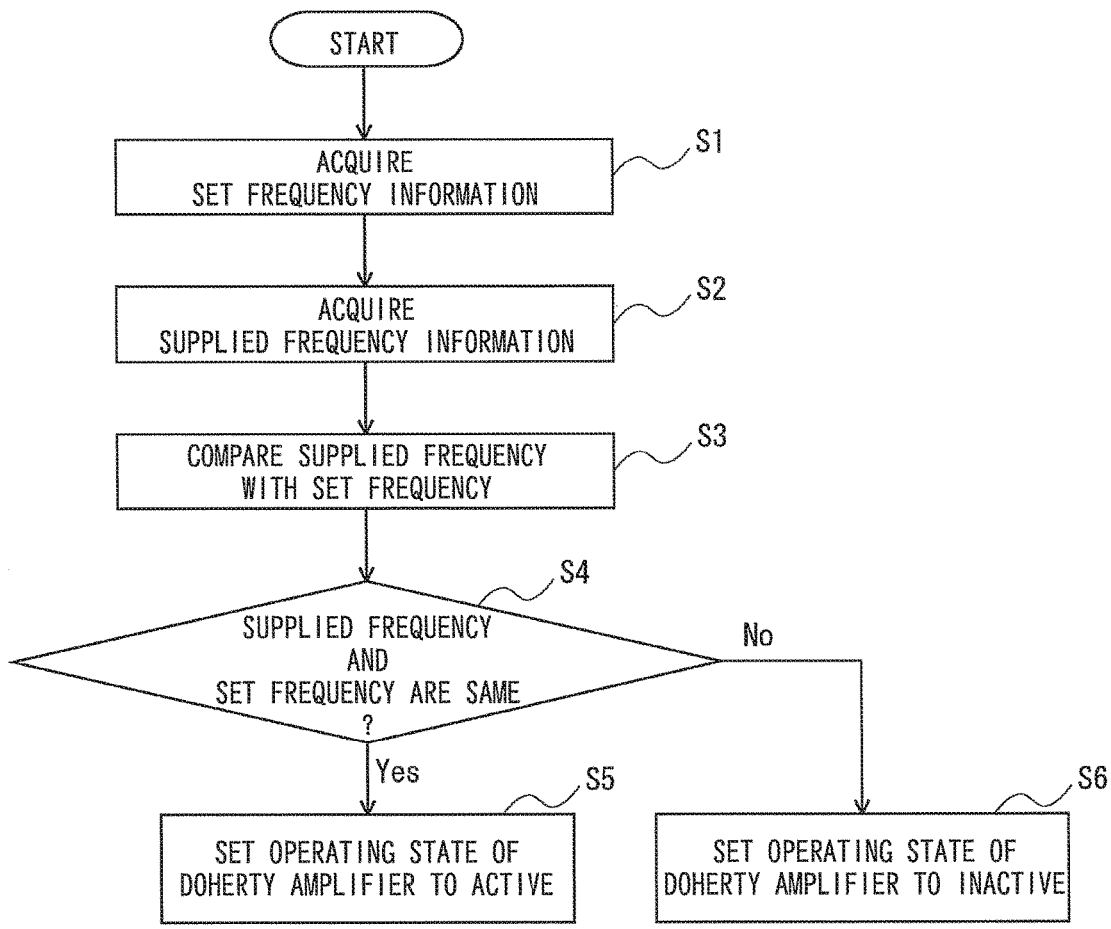
FIG. 3 is a flowchart illustrating the operation of the power amplification device according to the first exemplary embodiment.

The operation of the power amplification device 1 according to this exemplary embodiment is described hereinafter with reference to the flowchart of FIG. 3. It is assumed that, in the power amplification device 1 according to this exemplary embodiment, the set frequency information of the Doherty amplifier 10 is prestored in a memory or the like. Further, it is assumed that the process shown in FIG. 3 starts at the timing when the upper-level device that supplies the supplied frequency information 22 is connected to the power amplification device 1.

When the upper-level device is connected to the power amplification device 1, the frequency comparator 11 acquires the set frequency information 21 (Step S1). Further, the frequency comparator 11 acquires the supplied frequency information 22 from the upper-level device (Step S2). For example, the supplied frequency information 22 is supplied from the upper-level device to the power amplification device 1 by serial communication. Next, the frequency comparator 11 compares the supplied frequency of the input signal RF_IN that is supplied to the Doherty amplifier 10 with the set frequency of the Doherty amplifier 10 (Step S3). When the supplied frequency and the set frequency are the same (Yes in Step S4), the protection circuit 12 sets the operating state of the Doherty amplifier 10 to active (Step S5). In this case, the Doherty amplifier 10 operates, and the output signal RF_OUT is output from the power amplification device 1. On the other hand, when the supplied frequency and the set frequency are different (No in Step S4), the protection circuit 12 sets the operating state of the Doherty amplifier 10 to inactive (Step S6). In this case, the Doherty amplifier 10 does not operate, and the output signal RF_OUT is not output from the power amplification device 1. Note that the above-described Step S1 and Step S2 may be performed in a different order. Specifically, the frequency comparator 11 may acquire the set frequency information 21 after acquiring the supplied frequency information 22.

As described in the above Background Art, the Doherty amplifier includes a transmission line for matching the output impedance between the carrier amplifier and the peak amplifier. For example, in the Doherty amplifier disclosed in Patent Literature 1, the transmission line having an electrical length that is about ¼ wavelength of the frequency of an input signal is included. In this manner, the length of the transmission line of the Doherty amplifier corresponds to the frequency (set frequency) of an input signal to the Doherty amplifier. In other words, the Doherty amplifier is designed to operate at a specified set frequency. Heretofore, the Doherty amplifier has been used in the environment where the frequency of an input signal is constant. In the case of applying the Doherty amplifier to equipment (for example, broadcast equipment) where the frequency of an input signal varies frequently, when an input signal with a frequency different from the set frequency is supplied to the Doherty amplifier, the Doherty amplifier cannot operate normally or the Doherty amplifier can be damaged in some cases. However, the case where the set frequency and the frequency of an input signal are different is not assumed in the Doherty amplifier, and therefore a protection circuit for the purpose of protecting the Doherty amplifier has not been placed.

Particularly, in the case where the transmission line of the Doherty amplifier is designed in modules (exchangeable parts), by exchanging the transmission line of the Doherty amplifier with a transmission line that complies with the set frequency, it is possible to use one power amplification device at different set frequencies. However, in this case, because one power amplification device can be set at different set frequencies, there is a possibility that a user accidentally uses it as an amplifier that amplifies a signal with a frequency different from the current set frequency.

In light of the above, the power amplification device 1 according to this exemplary embodiment compares the supplied frequency, which is the frequency of the input signal RF_IN that is supplied to the Doherty amplifier 10, with the set frequency of the Doherty amplifier 10. When the supplied frequency and the set frequency are different, the operating state of the Doherty amplifier 10 is set to inactive. It is thereby possible to protect the Doherty amplifier 10 when the input signal RF_IN with a frequency different from the set frequency of the Doherty amplifier 10 is supplied.

Figure 4:
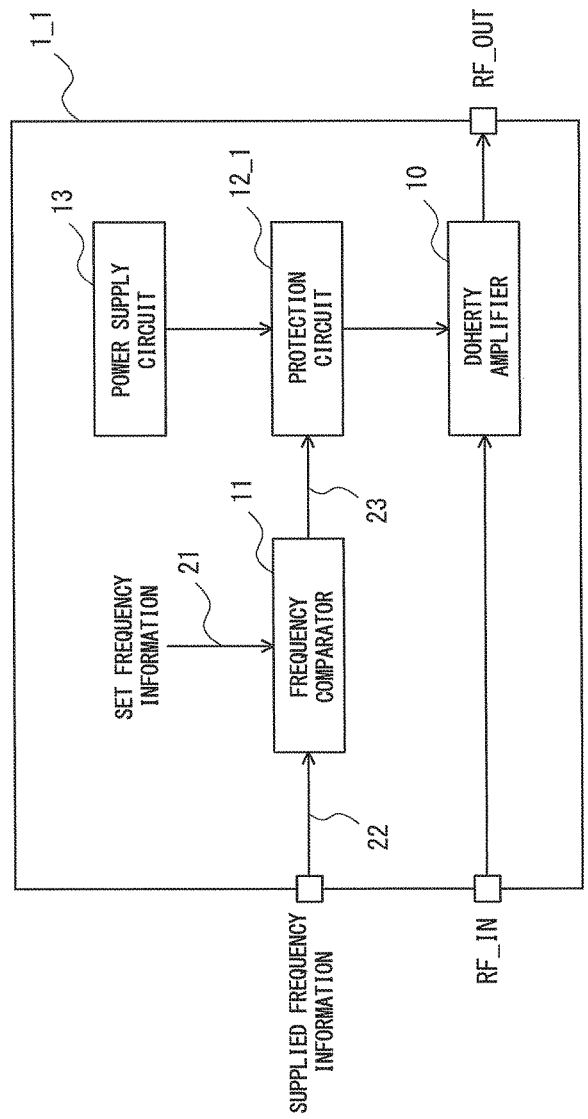
FIG. 4 is a block diagram showing one example of the power amplification device according to the first exemplary embodiment.

In the power amplification device 1 according to this exemplary embodiment, the operating state of the Doherty amplifier 10 can be set to inactive by restricting power supply to the Doherty amplifier 10, for example. FIG. 4 is a block diagram showing one example of the power amplification device according to this exemplary embodiment, and it is a block diagram showing a power amplification device 1_1 that sets the operating state of the Doherty amplifier 10 to inactive by restricting power supply to the Doherty amplifier 10.

The power amplification device 1_1 shown in FIG. 4 further includes a power supply circuit 13. The other elements are the same as those of the power amplification device 1 shown in FIG. 1. The power supply circuit 13 is a circuit that supplies power to the Doherty amplifier 10. When the supplied frequency of the input signal RF_IN that is supplied to the Doherty amplifier 10 and the set frequency of the Doherty amplifier 10 are different, a protection circuit 12_1 shuts off power supply from the power supply circuit 13 to the Doherty amplifier 10 and thereby sets the operating state of the Doherty amplifier 10 to inactive. In this case, the Doherty amplifier 10 does not operate, and the output signal RF_OUT is not output from the power amplification device 1_1.

On the other hand, when the supplied frequency of the input signal RF_IN that is supplied to the Doherty amplifier 10 and the set frequency of the Doherty amplifier 10 are the same, the protection circuit 12_1 supplies power from the power supply circuit 13 to the Doherty amplifier 10 and thereby sets the operating state of the Doherty amplifier 10 to active. In this case, the Doherty amplifier 10 operates, and the output signal RF_OUT is output from the power amplification device 1_1.

For example, the protection circuit 12_1 can be a switch element that switches the connection state (connected/non-connected) between the power supply circuit 13 and the Doherty amplifier 10 in accordance with the comparison result 23 of the frequency comparator 11.

Figure 5:
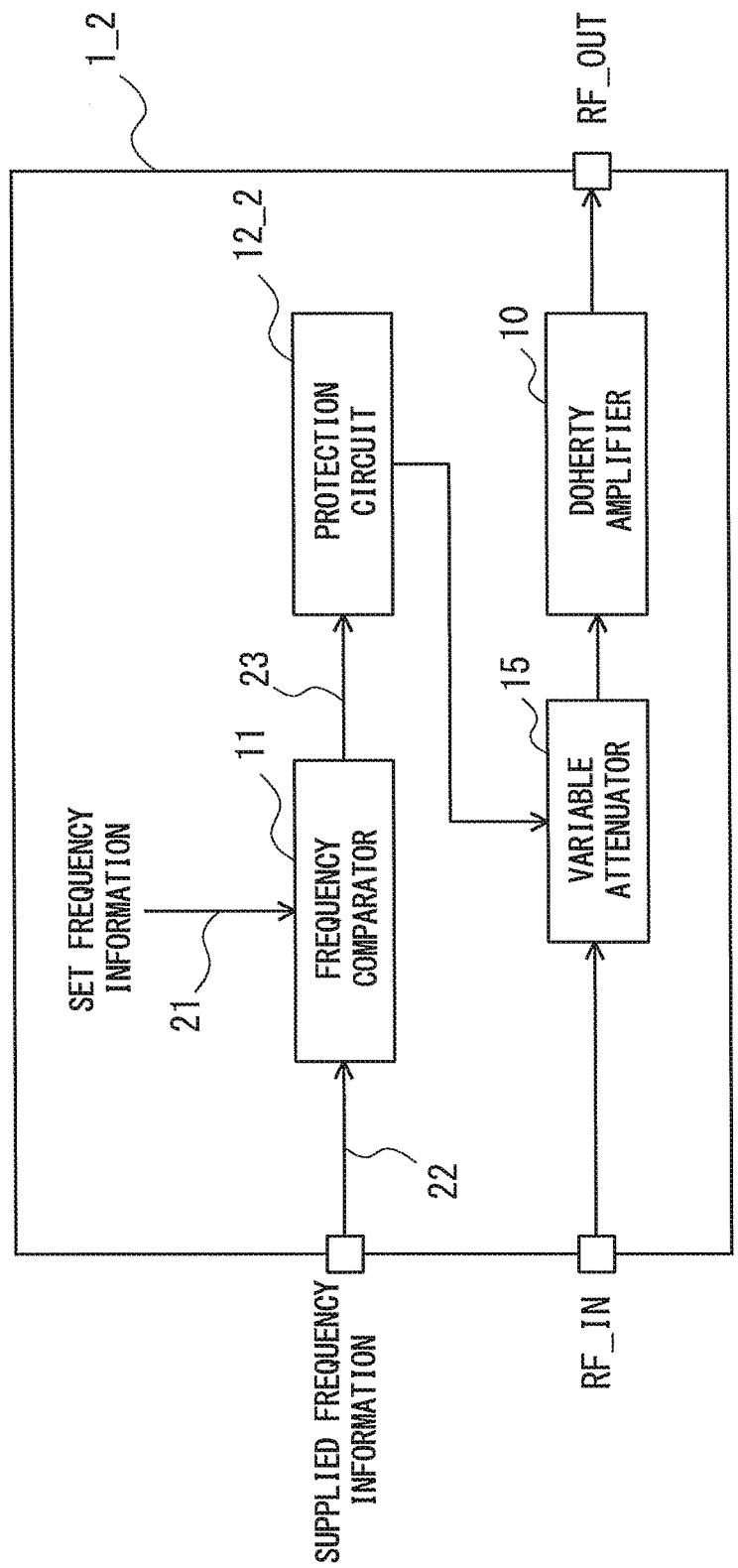
FIG. 5 is a block diagram showing another example of the power amplification device according to the first exemplary embodiment.

Further, in the power amplification device 1 according to this exemplary embodiment, the operating state of the Doherty amplifier 10 may be set to inactive by attenuating the input signal RF_IN to the Doherty amplifier 10 with use of a variable attenuator, for example. FIG. 5 is a block diagram showing another example of the power amplification device according to this exemplary embodiment, and it is a block diagram showing a power amplification device 1_2 that sets the operating state of the Doherty amplifier 10 to inactive by attenuating the input signal RF_IN to the Doherty amplifier 10.

The power amplification device 1_2 shown in FIG. 5 further includes a variable attenuator 15. The other elements are the same as those of the power amplification device 1 shown in FIG. 1. The variable attenuator 15 is an element that adjusts the level of the input signal RF_IN that is supplied to the Doherty amplifier 10. When the supplied frequency of the input signal RF_IN that is supplied to the Doherty amplifier 10 and the set frequency of the Doherty amplifier 10 are different, a protection circuit 12_2 attenuates the input signal RF_IN to the Doherty amplifier 10 (for example, maximizes the attenuation) by using the variable attenuator 15. It is thereby possible to set the operating state of the Doherty amplifier 10 to inactive. In this case, the Doherty amplifier 10 does not operate, and the output signal RF_OUT is not output from the power amplification device 1_2.

On the other hand, when the supplied frequency of the input signal RF_IN that is supplied to the Doherty amplifier 10 and the set frequency of the Doherty amplifier 10 are the same, the protection circuit 12_2 causes the variable attenuator 15 not to attenuate the input signal RF_IN to the Doherty amplifier 10 (for example, minimizes the attenuation). It is thereby possible to set the operating state of the Doherty amplifier 10 to active. In this case, the Doherty amplifier 10 operates, and the output signal RF_OUT is output from the power amplification device 1_2.

Figure 6:
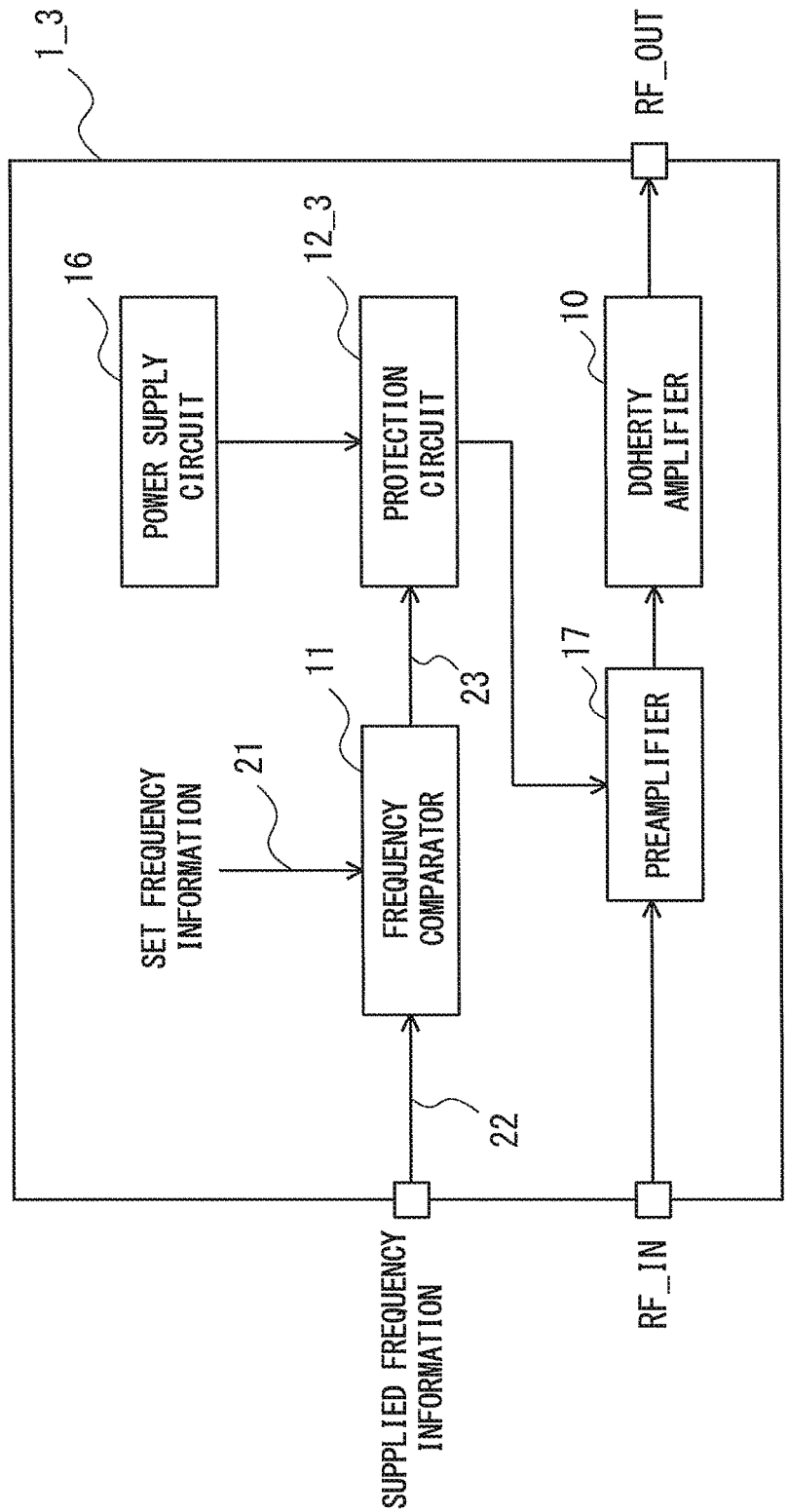
FIG. 6 is a block diagram showing another example of the power amplification device according to the first exemplary embodiment.

Further, in the power amplification device 1 according to this exemplary embodiment, the operating state of the Doherty amplifier 10 may be set to inactive by restricting power supply to a preamplifier that is placed in the previous stage of the Doherty amplifier 10, for example. FIG. 6 is a block diagram showing another example of the power amplification device according to this exemplary embodiment, and it is a block diagram showing a power amplification device 1_3 that sets the operating state of the Doherty amplifier 10 to inactive by restricting power supply to a preamplifier 17 that is placed in the previous stage of the Doherty amplifier 10.

The power amplification device 1_3 shown in FIG. 6 further includes a power supply circuit 16 and the preamplifier 17. The other elements are the same as those of the power amplification device 1 shown in FIG. 1. The power supply circuit 16 is a circuit that supplies power to the preamplifier 17. The preamplifier 17 is an amplifier that amplifies the input signal RF_IN up to a specified level. For example, the preamplifier 17 is a driver amplifier and can consist of RFIC (Radio Frequency Integrated Circuit) or the like.

When the supplied frequency of the input signal RF_IN that is supplied to the Doherty amplifier 10 and the set frequency of the Doherty amplifier 10 are different, a protection circuit 12_3 shuts off power supply from the power supply circuit 16 to the preamplifier 17. In this case, because the input signal RF_IN is not supplied from the preamplifier 17 to the Doherty amplifier 10, the operating state of the Doherty amplifier 10 becomes inactive.

On the other hand, when the supplied frequency of the input signal RF_IN that is supplied to the Doherty amplifier 10 and the set frequency of the Doherty amplifier 10 are the same, the protection circuit 12_3 supplies power from the power supply circuit 16 to the preamplifier 17. In this case, because the input signal RF_IN (the input signal amplified to a specified level) is supplied from the preamplifier 17 to the Doherty amplifier 10, the operating state of the Doherty amplifier 10 becomes active.

For example, the protection circuit 12_3 can be a switch element that switches the connection state (connected/non-connected) between the power supply circuit 16 and the preamplifier 17 in accordance with the comparison result 23 of the frequency comparator 11.

Figure 7:
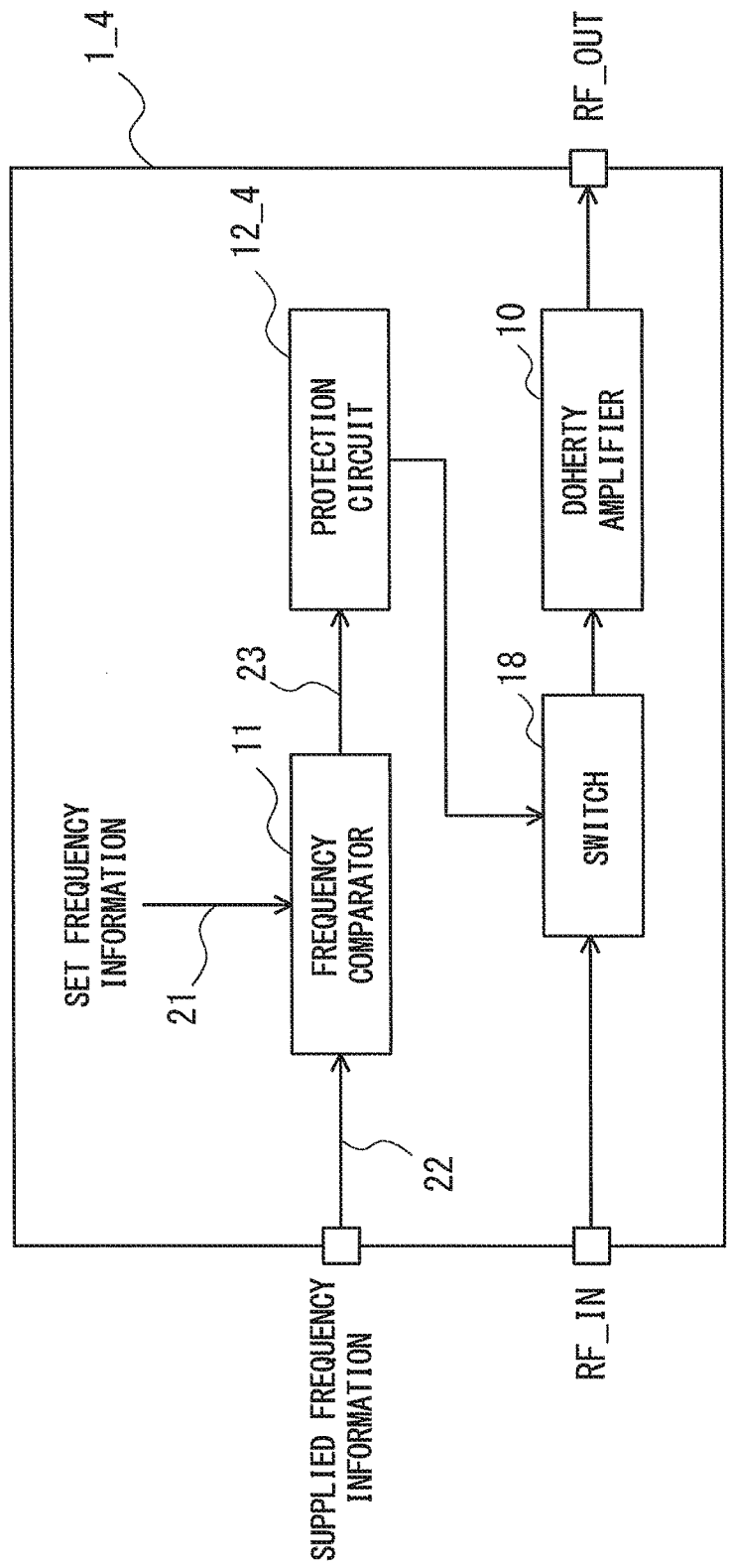
FIG. 7 is a block diagram showing another example of the power amplification device according to the first exemplary embodiment.

Further, in the power amplification device 1 according to this exemplary embodiment, a switch element may be placed in the previous stage of the Doherty amplifier 10, and the operating state of the Doherty amplifier 10 may be set to inactive by shutting off the input signal RF_IN to the Doherty amplifier 10 with use of the switch element, for example. FIG. 7 is a block diagram showing another example of the power amplification device according to this exemplary embodiment, and it is a block diagram showing a power amplification device 1_4 that sets the operating state of the Doherty amplifier 10 to inactive by shutting off the input signal RF_IN to the Doherty amplifier 10 with use of a switch element 18.

The power amplification device 1_4 shown in FIG. 7 further includes the switch element 18. The other elements are the same as those of the power amplification device 1 shown in FIG. 1. The switch element 18 is an element that switches between the case of supplying the input signal RF_IN to the Doherty amplifier 10 and the case of not supplying the input signal RF_IN to the Doherty amplifier 10. When the supplied frequency of the input signal RF_IN that is supplied to the Doherty amplifier 10 and the set frequency of the Doherty amplifier 10 are different, a protection circuit 12_4 shuts off the input signal RF_IN to the Doherty amplifier 10 by using the switch element 18. It is thereby possible to set the operating state of the Doherty amplifier 10 to inactive.

On the other hand, when the supplied frequency of the input signal RF_IN that is supplied to the Doherty amplifier 10 and the set frequency of the Doherty amplifier 10 are the same, the protection circuit 12_4 allows the input signal RF_IN to be supplied to the Doherty amplifier 10. It is thereby possible to set the operating state of the Doherty amplifier 10 to active.

According to the exemplary embodiment of the present invention described above, it is possible to provide a power amplification device capable of protecting a Doherty amplifier when a signal with a frequency different from a set frequency is supplied, and a control method of the power amplification device.

Second Exemplary Embodiment

Figure 8:
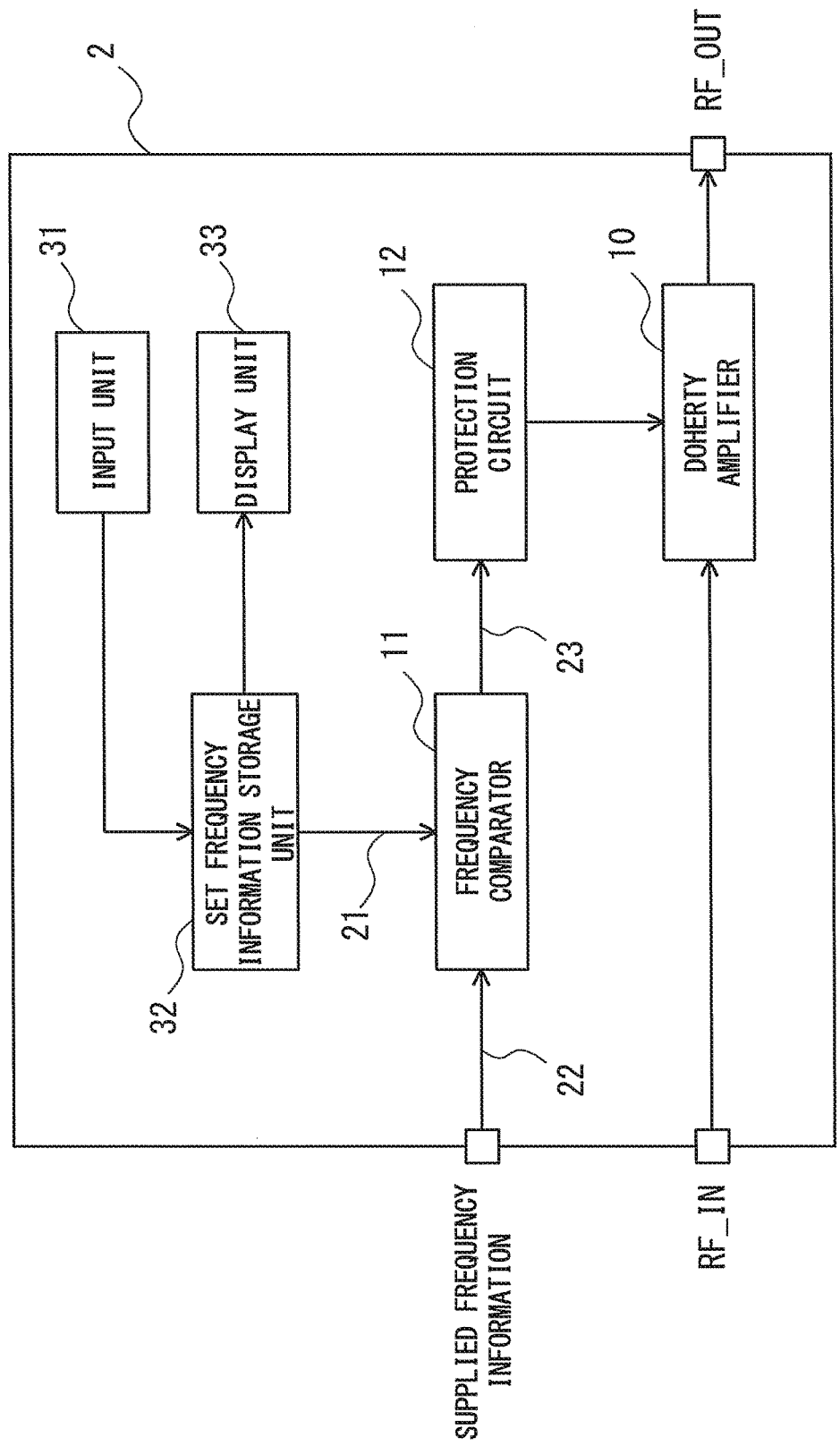
FIG. 8 is a block diagram showing a power amplification device according to a second exemplary embodiment.

A second exemplary embodiment of the present invention is described hereinafter. FIG. 8 is a block diagram showing a power amplification device 2 according to this exemplary embodiment. The power amplification device 2 according to this exemplary embodiment is different from the power amplification device described in the first exemplary embodiment in that it includes an input unit 31, a set frequency information storage unit 32, and a display unit 33. The other elements are the same as those of the power amplification device described in the first exemplary embodiment, and therefore the same elements are denoted by the same reference symbols and redundant description thereof is omitted. Note that, in this exemplary embodiment also, the operating state of the Doherty amplifier 10 may be set to inactive by restricting power supply to the Doherty amplifier 10, for example (see FIG. 4). Further, the operating state of the Doherty amplifier 10 may be set to inactive by attenuating the input signal RF_IN to the Doherty amplifier 10 with use of a variable attenuator, for example (see FIG. 5). Further, the operating state of the Doherty amplifier 10 may be set to inactive by restricting power supply to a preamplifier (see FIG. 6). Further, the operating state of the Doherty amplifier 10 may be set to inactive by shutting off the input signal RF_IN to the Doherty amplifier 10 with use of a switch element (see FIG. 7).

The input unit 31 is a user interface for inputting the set frequency of the Doherty amplifier 10. For example, the input unit 31 may be made using a rotary switch, a keyboard or the like. The set frequency information storage unit 32 stores the set frequency information that is input by the input unit 31. Further, the set frequency information storage unit 32 supplies the stored set frequency information to the frequency comparator 11 and the display unit 33.

The display unit 33 displays the set frequency stored in the set frequency information storage unit 32. The display unit 33 can be LED (Light Emitting Diode) or the like capable of displaying numeric, for example.

By placing the input unit 31, when the set frequency of the Doherty amplifier 10 is changed by exchanging the transmission line of the Doherty amplifier 10, for example, a user can update the set frequency information of the power amplification device 2 to new set frequency information. Further, because the power amplification device 2 according to this exemplary embodiment includes the display unit 33, it is possible to notify a user of the current set frequency of the Doherty amplifier 10. For example, the power supply of the display unit 33 is constructed using a power supply in a different system from the main power supply of the power amplification device 2 so that the set frequency is displayed on the display unit 33 even when the main power supply of the power amplification device 2 is off, and thereby a user can always see the set frequency of the power amplification device 2.

In this manner, by displaying the current set frequency on the display unit 33, it is possible to suppress the possibility that a user accidentally uses it as an amplifier that amplifies a signal with a frequency different from the current set frequency. Further, because a user can know the set frequency of the power amplification device 2 without seeing the size of the transmission line mounted on the power amplification device 2, it is possible to enhance the user-friendliness of the power amplification device 2.

The input unit 31 may be composed of a plurality of rotary switches that are placed corresponding to the respective significant digits of the set frequency. For example, when the set frequency has three significant digits, the input unit 31 may be composed of three rotary switches (specifically, a rotary switch corresponding to the first digit, a rotary switch corresponding to the second digit, and a rotary switch corresponding to the third digit). When the input unit 31 is composed of rotary switches, because the rotary switches can maintain values, the set frequency information storage unit 32 can be omitted.

Third Exemplary Embodiment

Figure 9:
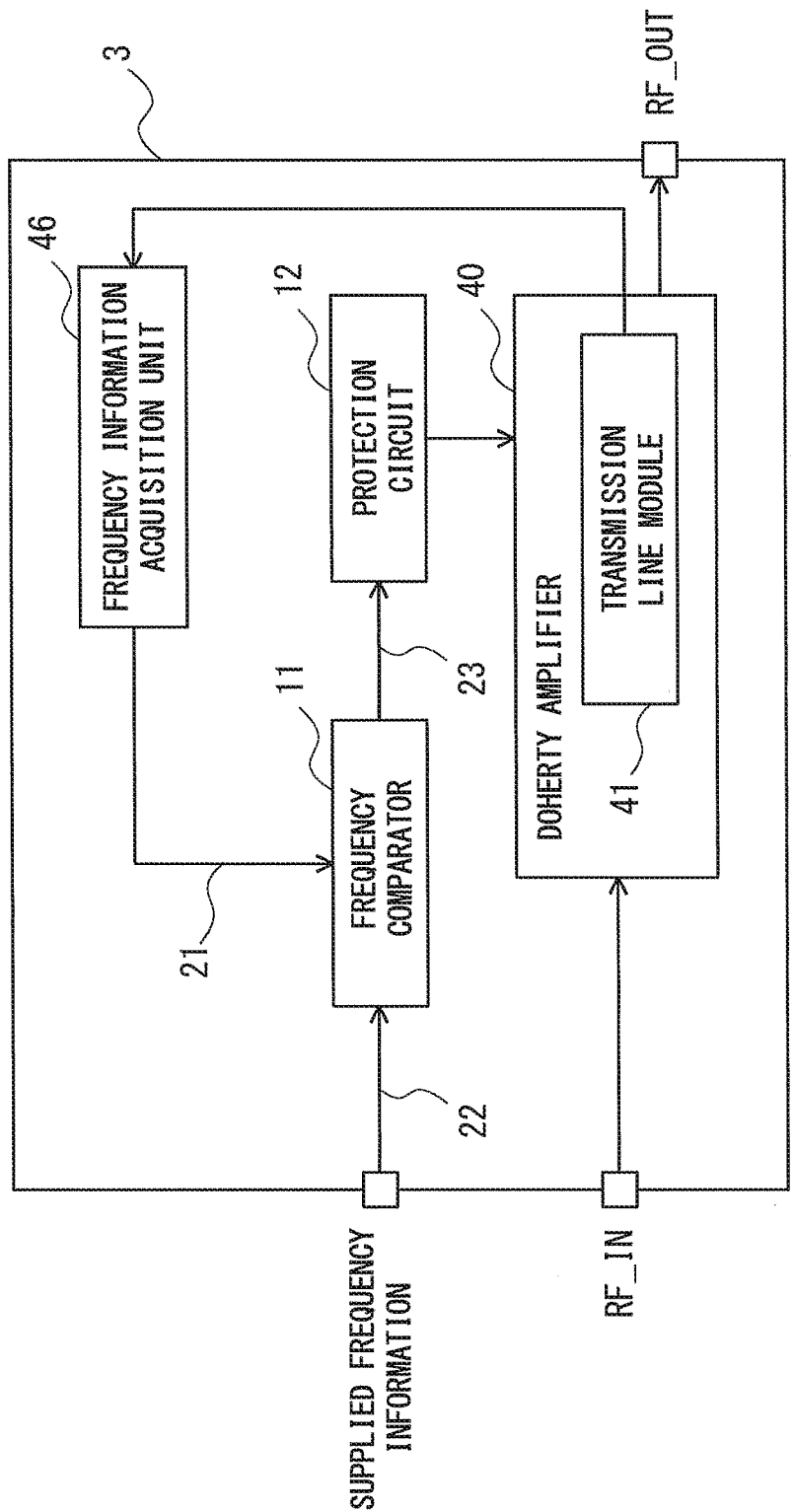
FIG. 9 is a block diagram showing a power amplification device according to a third exemplary embodiment.

A third exemplary embodiment of the present invention is described hereinafter. FIG. 9 is a block diagram showing a power amplification device 3 according to this exemplary embodiment. The power amplification device 3 according to this exemplary embodiment is different from the power amplification device described in the first exemplary embodiment in that a Doherty amplifier 40 includes a transmission line module 41, and the device includes a frequency information acquisition unit 46. The other elements are the same as those of the power amplification device described in the first exemplary embodiment, and therefore the same elements are denoted by the same reference symbols and redundant description thereof is omitted. Note that, in this exemplary embodiment also, the operating state of the Doherty amplifier 40 may be set to inactive by restricting power supply to the Doherty amplifier 40, for example (see FIG. 4). Further, the operating state of the Doherty amplifier may be set to inactive by attenuating the input signal RF_IN to the Doherty amplifier 40 with use of a variable attenuator, for example (see FIG. 5). Further, the operating state of the Doherty amplifier 10 may be set to inactive by restricting power supply to a preamplifier (see FIG. 6). Further, the operating state of the Doherty amplifier 10 may be set to inactive by shutting off the input signal RF_IN to the Doherty amplifier 10 with use of a switch element (see FIG. 7).

Figure 10:
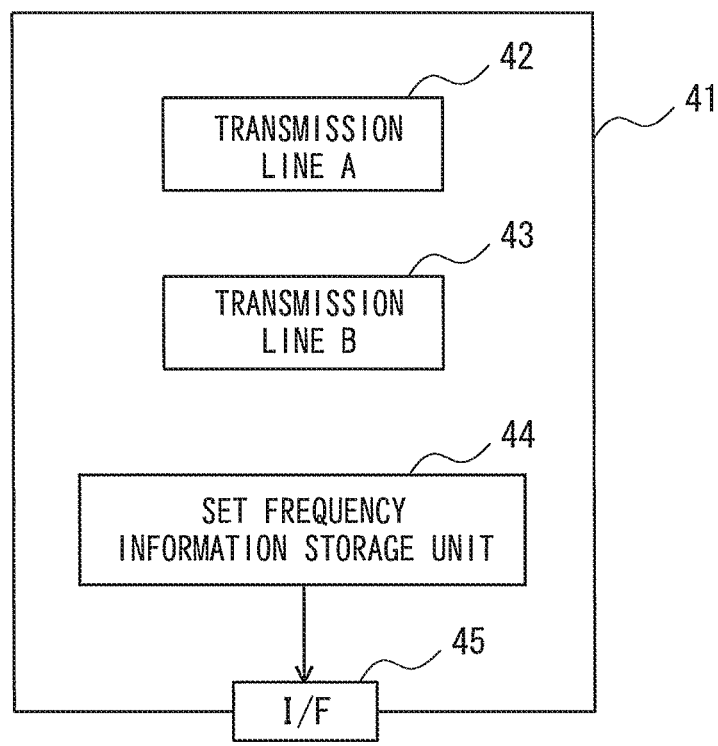
FIG. 10 is a block diagram showing one example of a transmission line module.

As shown in FIG. 9, the Doherty amplifier 40 that is included in the power amplification device 3 according to this exemplary embodiment includes the transmission line module 41. FIG. 10 is a block diagram showing one example of the transmission line module 41. As shown in FIG. 10, the transmission line module 41 includes a transmission line A (42), a transmission line B (43), a set frequency information storage unit 44, and an interface 45.

For example, the transmission line A (42) and the transmission line B (43) correspond to the transmission line A (114) and the transmission line B (115) of the Doherty amplifier shown in FIG. 2, respectively. The set frequency information storage unit 44 stores the set frequency corresponding to the transmission line module 41, which is the set frequency corresponding to the transmission line A (42) and the transmission line B (43). In other words, the set frequency information storage unit 44 stores a frequency at which the Doherty amplifier 40 including the transmission line module 41 operates.

The interface 45 is a connector, for example, and it is connected to the frequency information acquisition unit 46 when the transmission line module 41 is mounted on the power amplification device 3. As shown in FIG. 10, the transmission line module 41 is an integration of the transmission line A (42), the transmission line B (43) and the set frequency information storage unit 44. The transmission line module 41 is configured to be exchangeable according to the set frequency of the power amplification device 3 (Doherty amplifier 40).

The frequency information acquisition unit 46 acquires the set frequency information corresponding to the transmission line module 41 from the set frequency information storage unit 44 included in the transmission line module 41. The frequency information acquisition unit 46 supplies the acquired set frequency information 21 to the frequency comparator 11.

In this manner, in the power amplification device 3 according to this exemplary embodiment, the set frequency information corresponding to the transmission line module 41 is stored in the set frequency information storage unit 44 included in the transmission line module 41. Then, when the transmission line module 41 is mounted on the power amplification device 3, the frequency information acquisition unit 46 acquires the set frequency information corresponding to the transmission line module 41 from the set frequency information storage unit 44 included in the transmission line module 41. It is thereby possible to automatically acquire the set frequency information corresponding to the transmission line module 41.

For example, in the case where the set frequency information is input by a user using the input unit 31 as in the power amplification device 2 described in the second exemplary embodiment, the case can occur where the set frequency information is not correctly input due to the user's input error or the like. On the other hand, in the power amplification device 3 according to this exemplary embodiment, because the set frequency information corresponding to the transmission line module 41 can be acquired automatically, the power amplification device 3 can always acquire the correct set frequency information.

Although the present invention is described as a hardware configuration in the above first to third exemplary embodiments, the present invention is not limited thereto. The present invention may be implemented by causing a CPU (Central Processing Unit) to execute a computer program to perform the processing illustrated in the flowchart of FIG. 3.

The program can be stored and provided to the computer using any type of non-transitory computer readable medium. The non-transitory computer readable medium includes any type of tangible storage medium. Examples of the non-transitory computer readable medium include magnetic storage media (such as floppy disks, magnetic tapes, hard disk drives, etc.), optical magnetic storage media (e.g. magneto-optical disks), CD-ROM (Read Only Memory), CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable medium. Examples of the transitory computer readable medium include electric signals, optical signals, and electromagnetic waves. The transitory computer readable medium can provide the program to a computer via a wired communication line such as an electric wire or optical fiber or a wireless communication line.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

REFERENCE SIGNS LIST 1, 2, 3 POWER AMPLIFICATION DEVICE
10 DOHERTY AMPLIFIER
11 FREQUENCY COMPARATOR
12 PROTECTION CIRCUIT
13 POWER SUPPLY CIRCUIT
15 VARIABLE ATTENUATOR
16 POWER SUPPLY CIRCUIT
17 PREAMPLIFIER
18 SWITCH ELEMENT
31 INPUT UNIT
32 SET FREQUENCY INFORMATION STORAGE UNIT
33 DISPLAY UNIT
40 DOHERTY AMPLIFIER
41 TRANSMISSION LINE MODULE
42, 43 TRANSMISSION LINE
44 SET FREQUENCY INFORMATION STORAGE UNIT
45 INTERFACE
46 FREQUENCY INFORMATION ACQUISITION UNIT

What is claimed is:

1. A power amplification device comprising:
   a Doherty amplifier that is adjusted to operate at a set first frequency;
   a frequency comparator configured to receive the set first frequency and compare the set first frequency with a second frequency, which is a frequency of an input signal to the Doherty amplifier; and
   a protection circuit configured to set an operating state of the Doherty amplifier to inactive in response to the set first frequency and the second frequency being different.

2. The power amplification device according to claim 1, wherein the protection circuit is further configured to set the operating state of the Doherty amplifier to inactive by restricting power supply to the Doherty amplifier.

3. The power amplification device according to claim 1, further comprising:
   a variable attenuator that attenuates the input signal to the Doherty amplifier, wherein
   the protection circuit is further configured to set the operating state of the Doherty amplifier to inactive by attenuating the input signal to the Doherty amplifier with use of the variable attenuator.

4. The power amplification device according to claim 1, further comprising:
   a preamplifier that is placed in a previous stage of the Doherty amplifier and amplifies the input signal to a specified level, wherein
   the protection circuit is further configured to set the operating state of the Doherty amplifier to inactive by restricting power supply to the preamplifier.

5. The power amplification device according to claim 1, further comprising:
   a switch element that is placed in a previous stage of the Doherty amplifier, wherein
   the protection circuit is further configured to set the operating state of the Doherty amplifier to inactive by shutting off the input signal to the Doherty amplifier with use of the switch element.

6. The power amplification device according to claim 1, wherein
   the Doherty amplifier includes a transmission line, and
   the transmission line has a length corresponding to the set first frequency being a set frequency of the Doherty amplifier.

7. The power amplification device according to claim 6, wherein the transmission line is configured to be exchangeable according to the set first frequency.

8. The power amplification device according to claim 1, comprising:
   an input unit that inputs the set first frequency being a set frequency of the Doherty amplifier; and
   a display unit that displays the set first frequency input using the input unit.

9. The power amplification device according to claim 8, wherein the input unit is configured using a plurality of rotary switches placed corresponding to respective significant digits of the set first frequency.

10. The power amplification device according to claim 8, wherein
    the display unit has a power supply in a different system from a main power supply of the power amplification device, and the display unit displays the set first frequency even when the main power supply of the power amplification device is off.

11. The power amplification device according to claim 6, comprising:
   a transmission line module where the transmission line and a frequency information storage unit storing information related to the set first frequency corresponding to the transmission line module are integrated,
   the transmission line module is configured to be exchangeable according to the set first frequency, and
   the frequency comparator acquires the information related to the set first frequency from the frequency information storage unit.

12. A control method of a power amplification device, comprising:
   acquiring information related to a first frequency, which is a set frequency of a Doherty amplifier;
   acquiring information related to a second frequency, which is a frequency of an input signal to the Doherty amplifier; and
   comparing the first frequency with the second frequency, and when in response to the first frequency and the second frequency being different, setting an operating state of the Doherty amplifier to inactive.

13. A non-transitory computer readable medium storing a program causing a computer to perform a process comprising:
   acquiring information related to a first frequency, which is a set frequency of a Doherty amplifier;
   acquiring information related to a second frequency, which is a frequency of an input signal to the Doherty amplifier; and
   comparing the first frequency with the second frequency, and in response to the first frequency and the second frequency being different, setting an operating state of the Doherty amplifier to inactive.

* * * * *